(12) United States Patent
Oh et al.

(10) Patent No.: US 11,807,784 B2
(45) Date of Patent: Nov. 7, 2023

(54) PROTECTIVE TAPE AND DISPLAY DEVICE INCLUDING THE SAME

(71) Applicant: Samsung Display Co., Ltd., Yongin-si (KR)

(72) Inventors: Youngeun Oh, Hwaseong-si (KR); Sodam Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 760 days.

(21) Appl. No.: 16/655,160

(22) Filed: Oct. 16, 2019

(65) Prior Publication Data

US 2020/0224061 A1 Jul. 16, 2020

(30) Foreign Application Priority Data

Jan. 14, 2019 (KR) ........................ 10-2019-0004672

(51) Int. Cl.
*C09J 7/25* (2018.01)
*B32B 7/12* (2006.01)
(Continued)

(52) U.S. Cl.
CPC ................. *C09J 7/255* (2018.01); *B32B 7/12* (2013.01); *B32B 27/36* (2013.01); *B32B 27/40* (2013.01); *C09J 7/25* (2018.01); *C09J 7/30* (2018.01); *G02B 1/14* (2015.01); *G02B 6/325* (2013.01); *G06F 1/1616* (2013.01); *G06F 1/1641* (2013.01); *G09F 9/301* (2013.01); *H05K 5/0017* (2013.01); *H05K 5/03* (2013.01); *B32B 2307/732* (2013.01); *B32B 2457/20* (2013.01); *C09J 2433/00* (2013.01); *C09J 2467/006* (2013.01); *C09J 2475/006* (2013.01); *G06F 1/1652* (2013.01); *G06F 2200/1634* (2013.01); *Y10T 428/28* (2015.01)

(58) Field of Classification Search
None
See application file for complete search history.

(56) References Cited

U.S. PATENT DOCUMENTS 6,277,485 B1 * 8/2001 Invie .................... C09D 183/12
427/166
9,923,156 B2 3/2018 Jeong
(Continued)

FOREIGN PATENT DOCUMENTS

| CN | 105278147 | 1/2016 |
| CN | 106708171 | 5/2017 |

(Continued)

OTHER PUBLICATIONS

Extended European Search Report dated May 29, 2020, in European Patent Application No. 20151371.0.

*Primary Examiner* — Ramsey Zacharia
(74) *Attorney, Agent, or Firm* — H.C. Park & Associates, PLC

(57) ABSTRACT

A protective tape including a polymer film and an adhesive layer disposed on the polymer film. The adhesive layer has a storage modulus at −20° C. of 30 KPa to 100 KPa, and a creep value of 100% to 800% when a load of 3 N is maintained for 2 hours at room temperature. Thus, the protective tape is capable of maintaining a high adhesion value with respect to a display device while minimizing damage to the adhesive layer.

9 Claims, 9 Drawing Sheets

(51) Int. Cl.
*B32B 27/36* (2006.01)
*B32B 27/40* (2006.01)
*C09J 7/30* (2018.01)
*G02B 1/14* (2015.01)
*G02B 6/32* (2006.01)
*G06F 1/16* (2006.01)
*G09F 9/30* (2006.01)
*H05K 5/00* (2006.01)
*H05K 5/03* (2006.01)

(56) References Cited

U.S. PATENT DOCUMENTS

| | | | |
|---|---|---|---|
| 10,347,700 | B2 | 7/2019 | Yang et al. |
| 10,401,675 | B2 | 9/2019 | Lee et al. |
| 10,490,755 | B2 | 11/2019 | Jang et al. |
| 10,920,112 | B2 | 2/2021 | Park et al. |
| 2016/0004121 | A1 | 1/2016 | Inoamta |
| 2017/0002237 | A1 | 1/2017 | Cho et al. |
| 2017/0102738 | A1* | 4/2017 | Park .................... G06F 3/04883 |
| 2017/0200915 | A1 | 7/2017 | Lee et al. |
| 2018/0004254 | A1 | 1/2018 | Park et al. |
| 2018/0291240 | A1 | 10/2018 | Behling et al. |
| 2018/0356859 | A1* | 12/2018 | Hamburgen .......... H01L 27/323 |

FOREIGN PATENT DOCUMENTS

| | | |
|---|---|---|
| CN | 106960849 | 7/2017 |
| CN | 107230693 | 10/2017 |
| CN | 107250879 | 10/2017 |
| CN | 107871713 | 4/2018 |
| CN | 108122488 | 6/2018 |
| KR | 20170012739 | 2/2017 |
| KR | 20170084402 | 7/2017 |
| KR | 10-2017-0109746 | 10/2017 |
| KR | 10-2017-0113792 | 10/2017 |
| KR | 10-1814247 | 1/2018 |
| KR | 10-2018-0030747 | 3/2018 |
| KR | 20180028959 | 3/2018 |
| KR | 10-2018-0084525 | 7/2018 |
| WO | 2016148208 | 9/2016 |

* cited by examiner

- : Silane    -⊙- : Adhesive
- : Siloxane    ----- : Coupling
- : Alkyl chain    ~~ : Fluorinated carbon

PROTECTIVE TAPE AND DISPLAY DEVICE INCLUDING THE SAME

CROSS-REFERENCE TO RELATED APPLICATION

This application claims priority from and the benefit of Korean Patent Application No. 10-2019-0004627, filed on Jan. 14, 2019, which is hereby incorporated by reference for all purposes as if fully set forth herein.

BACKGROUND

Field

Exemplary embodiments of the invention relate generally to a protective tape and a display device including the same, and more specifically, to a protective tape used in a flexible display device and a display device including the same.

Discussion of the Background

A display device displays various images on a display screen to provide information to a user. In general, a display device displays information in an allocated screen. Recently, a flexible display device including a flexible display panel which is foldable or bendable are being developed. Unlike a rigid display device, the flexible display device may be folded, rolled, or bent. A flexible display device, the shape of which may be variously changed, is portable regardless of the original screen size thereof, and thus improving user convenience.

In order to protect the display surface of such a display device, a protective tape is applied. However, when stress is repeatedly applied to a folding portion or a bending portion, the protective tape may be deformed or damaged.

The above information disclosed in this Background section is only for understanding of the background of the inventive concepts, and, therefore, it may contain information that does not constitute prior art.

SUMMARY

Devices constructed according to exemplary embodiments of the invention are capable of providing a protective tape which maintains high adhesion strength and durability even with repeated folding.

The exemplary embodiments also provide a display device including a protective tape which has good adhesive properties with respect to the surface of a window, and the damage of which is minimized even with repeated folding.

Additional features of the inventive concepts will be set forth in the description which follows, and in part will be apparent from the description, or may be learned by practice of the inventive concepts.

An exemplary embodiment of the inventive concepts provides a protective tape including a polymer film and an adhesive layer disposed on the polymer film, having a storage modulus at −20° C. of 30 KPa to 100 KPa, and having a creep value of 100% to 800% when a load of 3 N is maintained for 2 hours at room temperature.

In an exemplary embodiment, the adhesion strength of the protective tape at room temperature with respect to a functional layer including a fluorine-containing silane compound, the functional layer being a target surface to be attached to, may be 10 gf/inch to 20 gf/inch.

In an exemplary embodiment, the thickness of the polymer film may be 70 μm to 130 μm.

In an exemplary embodiment, the thickness of the adhesive layer may be 35 μm to 65 μm.

In an exemplary embodiment, the adhesive layer may include a silicon-based resin, an acryl-based resin, or a urethane-based resin.

The polymer film may include at least one polymer resin among polyethyleneterephthalte (PET), poly(butylene terephthalate) (PBT), polyethylene naphthalene (PEN), polycarbonate (PC), poly(methylmethacrylate) (PMMA), polystyrene (PS), polyvinylchloride (PVC), polyethersulfone (PES), polypropylene (PP), polyamide (PA), modified polyphenylene ether (m-PPO), polyoxymethylene (POM), polysulfone (PSU), polyphenylene sulfide (PPS), poluimide (PI), polyethyleneimine (PEI), polyether ether ketone (PEEK), polyamide imide (PAI), polyarylate (PAR), and thermoplasitc polyurethane (TPU).

In an exemplary embodiment, the polymer film may be either a polyethylene terephthalate film or a thermoplastic polyurethane film, and the adhesive layer may be formed of an acryl-based resin.

In an exemplary embodiment of the inventive concepts, a display device includes a display module foldable about at least one bending axis, and a protective tape disposed on the display module and including a polymer film and an adhesive layer disposed between the polymer film and the display module, wherein the adhesive layer has a storage modulus at −20° C. of 30 KPa to 100 KPa, and has a creep value of 100% to 800% when a load of 3 N is maintained for 2 hours at room temperature.

In an exemplary embodiment, the display module and the protective tape may be folded to have a radius of curvature of 1 mm to 5 mm about at least one bending axis extended in one direction.

In an exemplary embodiment, the at least one bending axis may include a first bending axis and a second bending axis which are spaced apart from each other.

In an exemplary embodiment, the display device may be in-foldable about the first bending axis, and in-foldable and out-foldable about the second bending axis.

In an exemplary embodiment, the display module may include a display panel and a window disposed on the display panel.

In an exemplary embodiment, the window may include a base substrate and at least one functional layer disposed on the base substrate and including a fluorine-containing silane compound.

In an exemplary embodiment, the adhesion strength of the protective tape with respect to the at least one functional layer may be 10 gf/inch to 20 gf/inch.

In an exemplary embodiment, the thickness of the polymer film may be 70 μm to 130 μm, and the thickness of the adhesive layer may be 35 μm to 65 μm.

In an exemplary embodiment, the polymer film may be either a polyethylene terephthalate film or a thermoplastic polyurethane film, and the adhesive layer may be formed of an acryl-based resin.

In another exemplary embodiment of the inventive concepts, a display device including a bending portion which is able to be deformed to a bent shape or has a bent shape about a bending axis extending in one direction, the display device includes a display module and a protective tape disposed on the display module, wherein the protective tape includes an adhesive layer in contact with the display module and a polymer film disposed on the adhesive layer, wherein the adhesive layer has a storage modulus at −20° C. of 30 KPa to 100 KPa, and has a creep value of 100% to 800% when a load of 3 N is maintained for 2 hours at room temperature.

In an exemplary embodiment, the display module may include a display panel and a window disposed on the display panel, wherein the adhesive layer may be in contact with the window.

In an exemplary embodiment, the window may include a base substrate and a functional layer disposed on the base substrate, wherein the adhesion strength of the protective tape for the functional layer may be 10 gf/inch to 20 gf/inch.

In an exemplary embodiment, the adhesive layer may be a pressure sensitive adhesive (PSA) formed of an acryl-based resin.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
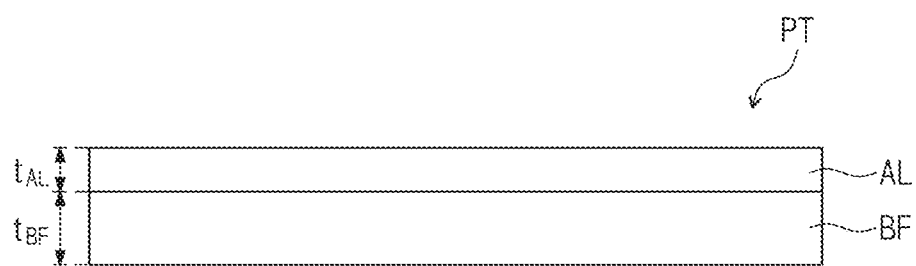
FIG. 1 is a cross-sectional view of a protective tape according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
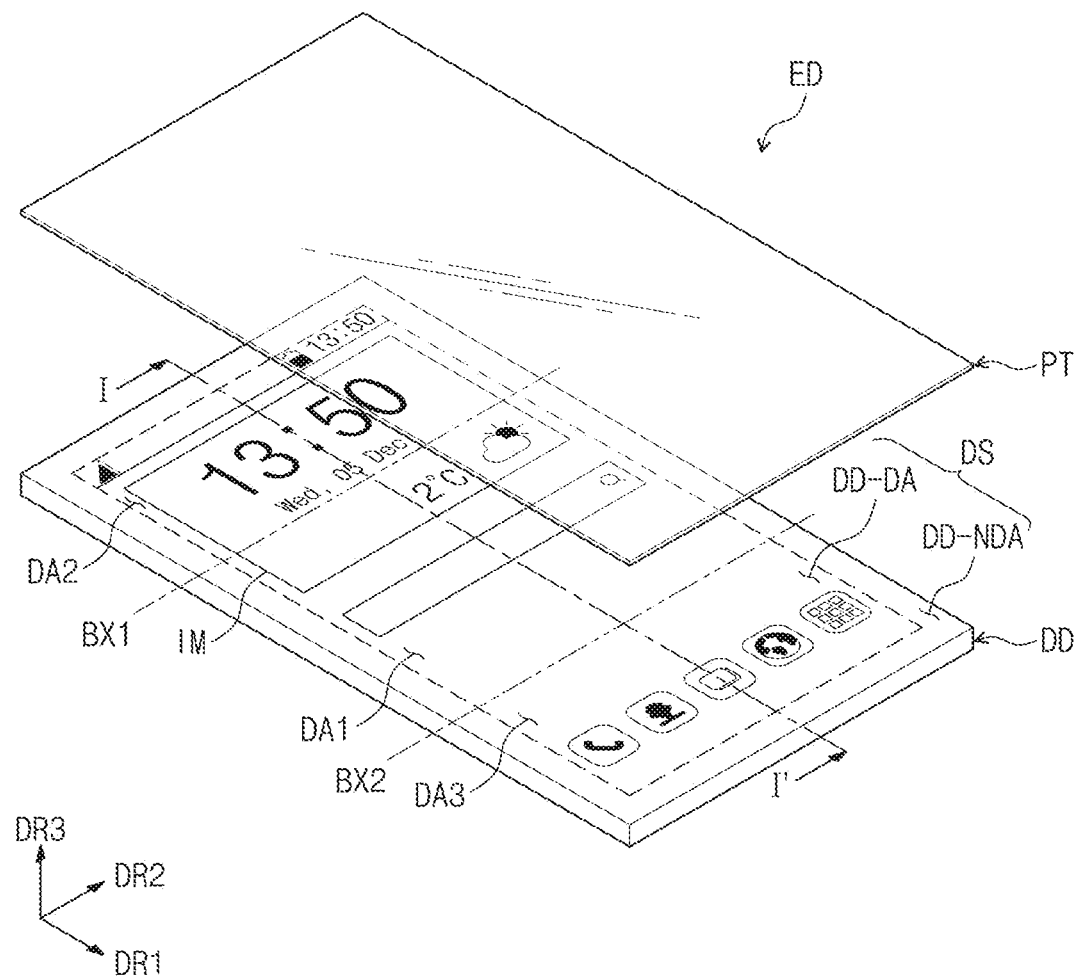
FIG. 2 is an exploded perspective view of a display device according to an exemplary embodiment of the inventive concepts.

FIG. 1 is a cross-sectional view of a protective tape PT of an exemplary embodiment. FIG. 2 is an exploded perspective view showing a display device ED of an exemplary embodiment.

The protective tape PT of an exemplary embodiment includes a polymer film BF and an adhesive layer AL disposed on the polymer film BF. In the protective tape PT according to an exemplary embodiment, the adhesive layer AL may have a storage modulus at −20° C. of 30 KPa to 100 KPa, and may have a creep value of 100% to 800% when a load of 3 N is maintained for 2 hours at room temperature. Meanwhile, as used herein, room temperature may correspond to a temperature of about 25° C.

The adhesion strength of the protective tape PT according to an exemplary embodiment may be 10 gf/inch to 20 gf/inch at room temperature. The adhesion strength of the protective tape PT may be a value with respect to a functional layer provided on a glass substrate. Meanwhile, the functional layer may be a layer including a fluorine-containing silane compound. That is, the adhesion strength of the protective tape PT with respect to the functional layer may be 10 gf/inch to 20 gf/inch. For example, the adhesion strength of the protective tape PT at room temperature with respect to the functional layer including a fluorine-containing silane compound, the functional layer being a target surface to be attached to, may be 10 gf/inch to 20 gf/inch.

The protective tape PT according to an exemplary embodiment may be included in the display device ED. The protective tape PT may be applied on a display module DD to protect the surface of the display module DD. The protective tape PT is transparent. Therefore, even with the protective tape PT attached, image information provided from a display surface DS of the display module DD may be confirmed. Also, the protective tape PT does not maintain permanent adhesion with respect to the surface of the display module DD. The protective tape PT has adhesive properties to a degree in which, when the protective tape PT is removed according to the user's intention, the adhesive layer AL is not transferred onto the surface of the display module DD and easily detached. For example, in the protective tape PT of an exemplary embodiment, the adhesive layer AL may be a pressure sensitive adhesive (PSA).

Meanwhile, the display device ED according to an exemplary embodiment, which includes the protective tape PT of an exemplary embodiment, may be a flexible display device which is foldable or bendable or which may stay in a folded state or in a bent state. In the present specification, being flexible refers to having properties of being able to be bent, which not only includes being able to be bent until completely folded, but also includes being able to be bent to a degree of a few nanometers (nm).

The protective tape PT according to an exemplary embodiment includes the adhesive layer AL which has low viscosity elasticity of 30 KPa to 100 KPa at −20° C., and has a creep value of 100% to 800% at room temperature, and thus may maintain good adhesion strength and excellent durability even when the shape thereof is deformed due to repeated bending or folding. That is, even when the protective tape PT according to an exemplary embodiment is repeatedly deformed, the stress at the time of shape deformation is relaxed in the adhesive layer AL, so that the adhesive layer AL may not be pushed or whitened.

Also, in the protective tape PT according to an exemplary embodiment, the adhesive layer AL has low viscosity elasticity of 30 KPa to 100 KPa at −20° C., so that even when the protective tape PT is deformed, shear stress is relaxed inside the adhesive layer AL, thereby reducing shear stress reaching an interface between a target surface to which the adhesive layer AL is attached and the adhesive layer AL. That is, a peeling-off phenomenon at the interface between the adhesive layer AL and the target surface to be attached to may be minimized under a low-temperature condition (for example, at 20° C.).

The adhesive layer AL having a high creep value of 100% to 800% in the protective tape PT according to an exemplary embodiment has increased decoupling properties in the adhesive layer AL. Therefore, compressive stress applied to the target surface to be attached to or the polymer film BF in contact with the adhesive layer AL at the time of deformation such as folding or bending may be reduced. Accordingly, the adhesive layer AL has high creep properties, so that deformation that may cause wrinkles or the like on the protective tape PT may be minimized.

The adhesion strength of the protective tape PT according to an exemplary embodiment is 10 gf/inch to 20 gf/inch. When the adhesion strength thereof is less than 10 gf/inch, adhesion with respect to the surface of the display module DD is not sufficient, so that the protective tape PT may be peeled off when the display device ED is folded. Also, if the adhesion strength is greater than 20 gf/inch, when the protective tape PT is needed to be removed, the adhesive layer AL may not be easily detached from the surface of the display module DD.

In the present specification, the storage modulus of the adhesive layer AL of the protective tape PT corresponds to a value measured with a rheometer (TA Instruments Co.). A sample for the storage modulus measurement was prepared by processing the adhesive layer AL in the form of a disk having a diameter of 8 mm and a thickness 600 mm. The storage modulus was measured with the rheometer by applying a torque of 200 mN.m and a frequency of 1 Hz and increasing the temperature at a rate of 3° C./min with a normal force of 0.5 N applied.

When the storage modulus at −20° C. of the adhesive layer AL in the protective tape PT according to an exemplary embodiment is less than 30 KPa, the strength of the adhesive layer AL is reduced to deteriorate durability, so that the adhesion of the protective tape PT may be deteriorated. Also, the adhesive layer AL having a storage modulus of less than 30 KPa at −20° C. has increased properties of being soft, so that the processibility of processing the same into the protective tape PT in a form applicable to the display device ED may be deteriorated.

Meanwhile, when the storage modulus at −20° C. of the adhesive layer AL in the protective tape PT according to an exemplary embodiment is greater than 100 KPa, the strength of the adhesive layer AL is increased, so that the stress relaxation effect in the adhesive layer AL may be deteriorated. Accordingly, when an operation of folding or unfolding the display device ED is performed, or when the folded state of the display device ED is maintained, the adhesive layer AL may be permanently deformed, or the adhesion of the protective tape PT with respect to the display module DD may be deteriorated.

The creep value of the adhesive layer AL in the protective tape PT according to an exemplary embodiment may be 100% to 800%, and in the present specification, the creep value may be a value defined by Equation 1 below.

$$\text{Creep (\%)} = \{(L-L_0)/L_0\} \times 100\% \quad \text{Equation 1}$$

In Equation 1, $L_0$ corresponds to an initial length of an adhesive layer AL sample provided for the creep measurement, and L corresponds to a length of the adhesive layer AL sample measured after applying a constant load to one end of the adhesive layer AL sample and maintaining the state for a predetermined time.

In the present specification, the creep value of the adhesive layer AL was measured at 25° C., which is room temperature, with Thermomechanical Analysis (TMA) (Netzsch Co.). For the creep measurement, an adhesive layer AL sample was processed so as to have a length of 1.5 cm and a width of 0.5 cm, and the change in length thereof was measured after applying a load of 3 N to one end of the adhesive layer AL sample and maintaining the state for 2 hours. That is, in the creep measurement, the creep value 100% corresponds to a case in which L is $2L_0$.

In the protective tape PT according to an exemplary embodiment, the adhesive layer AL may have a creep value of 100% to 800% at room temperature. When the creep value of the adhesive layer AL is less than 100%, the stress relaxation effect in the adhesive layer AL may be deteriorated. Accordingly, when an operation of folding or unfolding the display device ED is performed, or when the folded state of the display device ED is maintained, the adhesive layer AL may be permanently deformed, or the adhesion with respect to the display module DD may be deteriorated. Also, when the creep value of the adhesive layer AL is greater than 800%, the strength of the adhesive layer AL is reduced, thereby deteriorating durability, so that the adhesion of the protective tape PT may be deteriorated. Also, when the creep value of the adhesive layer AL is greater than 800%, the adhesive layer AL has increased properties of being soft, so that when an operation of folding or unfolding the display device ED is performed, restoring force may be reduced.

In the present specification, the adhesion strength of the protective tape PT corresponds to a value measured by a 180° peel test method. The protective tape PT according to an exemplary embodiment may have an adhesion strength of 10 gf/inch to 20 gf/inch at room temperature. Meanwhile, when measuring the adhesion strength of the protective tape PT, a glass substrate provided with a functional layer was used as a target surface to be attached to. The functional layer which is the target surface to be attached to may be a layer including a fluorine-containing silane compound.

In a protective tape PT sample for the 180° peel test method, the thickness of the adhesive layer AL was set to 50 μm and the thickness of the polymer film BF was set to 100 μm. The sample was processed so as to have a width of 1" (inch) and a length of 5", attached to the target surface to be attached to, and then left for 3 hours to proceed the 180° peel test. The peeling rate was set to 300 mm/min.

In an exemplary embodiment, the polymer film BF may include at least one polymer resin among polyethyleneterephthalte (PET), poly(butylene terephthalate) (PBT), polyethylene naphthalene (PEN), polycarbonate (PC), poly(m-ethylmethacrylate (PMMA), polystyrene (PS), polyvinylchloride (PVC), polyethersulfone (PES), polypropylene (PP), polyamide (PA), modified polyphenylene ether (m-PPO), polyoxymethylene (POM), polysulfone (PSU), polyphenylene sulfide (PPS), poluimide (PI), polyethyleneimine (PEI), polyether ether ketone (PEEK), polyamide imide (PAI), polyarylate (PAR), and thermoplasitc polyurethane (TPU).

For example, in the protective tape PT of an exemplary embodiment, the polymer film BF may be a polyethylene terephthalate (PET) film or a thermoplastic polyurethane (TPU) film. Also, the PET film used as the polymer film BF may be a thin retardation film (TRF) or a super retardation film (SRF) which have optical functionality.

In the protective tape PT of an exemplary embodiment, the polymer film BF may have a thickness $t_{BF}$ of 70 μm to 130 μm. When the thickness of the polymer film BF is less than 70 μm, durability for protecting the surface of the display module DD may be deteriorated. Also, when the thickness of the polymer film BF is greater than 130 μm, the thickness of the entire display device ED is increased, so that folding properties may be deteriorated.

In the protective tape PT according to an exemplary embodiment, the adhesive layer AL may include a silicon-based resin, an acryl-based resin, or a urethane-based resin. The adhesive layer AL may be formed of a polymer resin including a silicon-based resin, an acryl-based resin, or a urethane-based resin. For example, in the protective tape PT of an exemplary embodiment, the adhesive layer AL may be formed of an acryl-based resin.

That is, in the protective tape PT according to an exemplary embodiment, the polymer film BF may be a polyethylene terephthalate (PET) film or a thermoplastic polyurethane (TPU) film, and the adhesive layer AL may be formed of an acryl-based resin.

In the protective tape PT of an exemplary embodiment, the adhesive layer AL may have a thickness $t_{AL}$ of 35 µm to 65 µm. When the thickness of the adhesive layer AL is less than 35 µm, the adhesion of the protective tape PT with respect to the display module DD may be deteriorated. Also, when the thickness of the adhesive layer AL is greater than 65 µm, the thickness of the entire display device ED is increased, so that folding properties may be deteriorated.

Figure 3A:
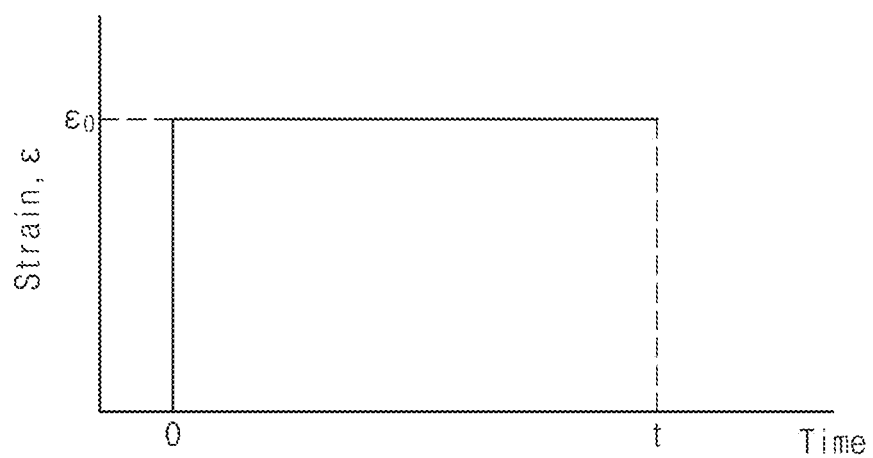
FIG. 3A shows a shear strain curve for an adhesive layer according to an exemplary embodiment of the inventive concepts.
Figure 3B:
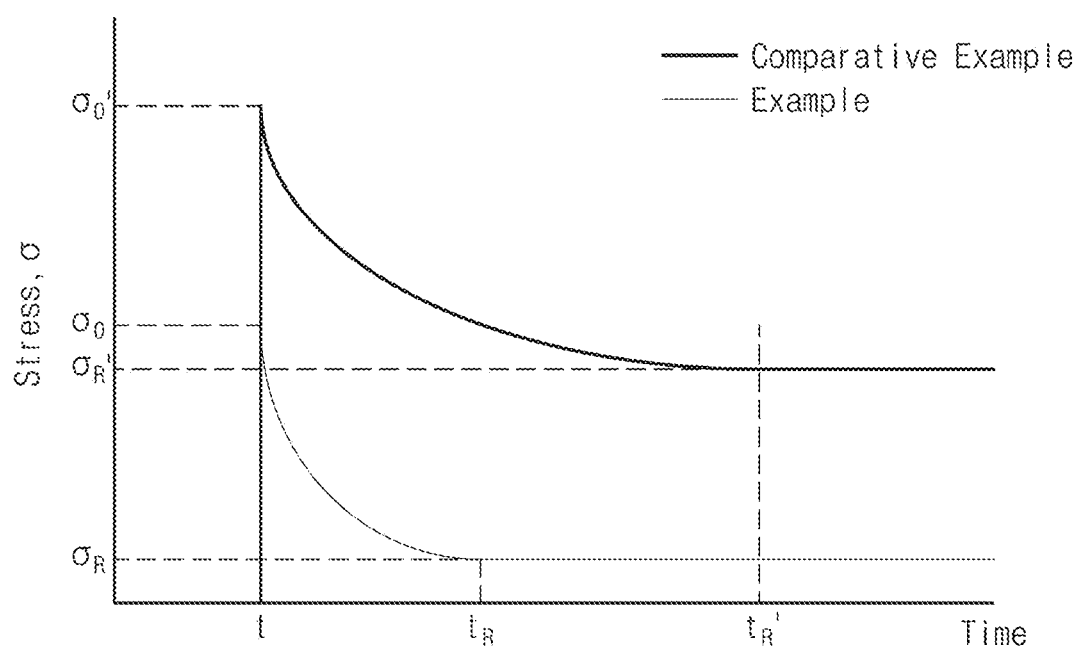
FIG. 3B shows a stress relaxation curve for an adhesive layer over time according to an exemplary embodiment of the inventive concepts.

FIG. 3A is a view showing a shear strain curve for an adhesive layer according to an exemplary embodiment of the inventive concepts, and FIG. 3B is a view showing a stress relaxation curve for the adhesive layer after the shear strain is removed. FIG. 3B corresponds to showing a change in stress value after maintaining the shear strain state for t hours as shown in FIG. 3A. That is, FIG. 3B may correspond to an output curve showing a change in stress after removing shear strain with respect to an input curve showing a state in which the shear strain is maintained as shown in FIG. 3A.

FIG. 3A shows that the shear strain value for an adhesive layer sample is maintained at a c state for t hours. FIG. 3B shows stress relaxation curves for adhesive layers of Comparative Example and Example after shear strain to maintain a shear strain state is removed.

In FIG. 3B, Example corresponds to the adhesive layer AL of the protective tape PT according to an exemplary embodiment of the inventive concepts, and Comparative Example corresponds to an adhesive layer sample having a relatively high storage modulus and a relatively low creep value compared with those of the adhesive layer AL used in an exemplary embodiment of the inventive concepts.

In the case of Example, a value of initial stress $\sigma_0$ after the shear strain was removed was lower than a value of initial stress $\sigma_0'$ of Comparative Example. Also, in the case of Example, a value of finally remaining stress $\sigma_R$ in an adhesive layer was lower than a value of finally remaining stress $\sigma_R'$ in an adhesive layer of Comparative Example. Such low stress value of Example is believed to be due to a low storage modulus value of the adhesive layer of Example.

Also, in the case of Example, a restoration time $t_R$, which is time taken for the sample to restore the original state thereof from a modified state, was shorter than a restoration time $t_R'$ of the Comparative Example sample, and in the case of Example, a slope of the stress relaxation curve up to the time $t_R$ after the shear strain was removed was greater than a slope of the stress relaxation curve up to the time $t_R'$ after the shear strain was removed in Comparative Example. This shows that the shear strain of the Example sample is recovered faster than that of the Comparative Example sample, and the stress value of the final deformation state of Example sample is lower than that of Comparative Example sample.

That is, in the protective tape PT according to an exemplary embodiment, the adhesive layer AL is allowed to have a low storage modulus and a high creep value, thereby having good adhesion strength and improved stress relaxation properties, so that even when the deformation of the protective tape PT is repeated, such as folding the same, excellent durability may be obtained.

Referring to FIG. 2 showing the display device ED according to an exemplary embodiment, the display device ED may include the display module DD and the protective tape PT disposed on the display module DD.

Referring to FIG. 2, in the display module DD according to an exemplary embodiment, the display surface DS on which an image IM is displayed may be parallel to a plane defined by a first direction axis DR1 and a second direction axis DR2. The normal direction of the display surface DS, that is, the thickness direction of the display module DD, is indicated by a third direction axis DR3. A front surface (or an upper surface) and a rear surface (or a lower surface) of each member may be defined by the third direction axis DR3. However, directions indicated by the first to third direction axes DR1, DR2, and DR3 are a relative, and may be converted to other directions. Hereinafter, first to third directions correspond to directions indicated by the first to third direction axes DR1, DR2, DR3, respectively, and are given the same reference numerals.

The display device ED according to an exemplary embodiment of the inventive concepts may be a flexible display device. The display device ED according to an exemplary embodiment may be a foldable display device including the display module DD which may be foldable about at least one of bending axes BX1 or BX2 which are extended in one direction.

The display device ED according to the inventive concepts may be used in a large-sized electronic devices such as a television and a monitor, and in a small-and-medium-sized electronic devices such as a mobile phone, a tablet computer, a car navigation system, a game machine, and a smart watch. In FIG. 2, the display device ED is exemplarily illustrated as being a smart phone.

As shown in FIG. 2, the display surface DS of the display device ED may include a plurality of regions. The display surface DS of the display device ED may include a display region DD-DA on which the image IM is displayed and a non-display region DD-NDA adjacent to the display region DD-DA. The non-display region DD-NDA is a region on which the image IM is not displayed. In the display device ED of an exemplary embodiment shown in FIG. 2, the non-display region DD-NDA is illustrated as being disposed surrounding the display region DD-DA, but exemplary embodiments of the inventive concepts are not limited thereto.

In FIG. 2, as an example of the image IM, application icons and a watch window are illustrated. The display region DD-DA may have a quadrangular shape. However, exemplary embodiments of the inventive concepts are not limited thereto. The shape of the display region DD-DA and the shape of the non-display region DD-NDA may be correlatively designed.

The display region DD-DA may include a plurality of sub-display regions DA1, DA2, and DA3. The display region DD-DA may include a first display region DA1, a second display region DA2, and a third display region DA3.

The first display region DA1 may be disposed between the second display region DA2 and the third display region DA3. Each of the second display region DA2 and the third display region DA3 may be extended in the first display region DA1.

Between the first display region DA1 and the second display region DA2, a first bending axis BX1 may be defined. Between the first display region DA1 and the third display region DA3, a second bending axis BX2 may be defined. The first bending axis BX1 and the second bending axis BX2 may be spaced apart from each other.

In FIG. 2, two bending axes BX1 and BX2 are exemplarily illustrated. However, exemplary embodiments of the inventive concepts are not limited thereto. Depending on the design of the display device ED of an exemplary embodiment, or the usage required in the display device ED, the number of bending axes may vary. For example, in the display device ED of an exemplary embodiment, there may be one bending axis. When there is one bending axis defined, the bending axis may be defined to overlap a middle portion the display device ED. Also, in the display device ED of an exemplary embodiment, there may be three or more bending axes.

Meanwhile, in FIG. 2, both the first bending axis BX1 and the second bending axis BX2 are illustrated as being parallel to the second direction axis DR2. However, exemplary embodiments of the inventive concepts are not limited thereto. The extension direction of the first bending axis BX1 and the extension direction of the second bending axis BX2 may be different from each other. Also, at least one of the first bending axis BX1 or the second bending axis BX2 may not be parallel to the second direction axis DR2 but may be extended in a direction different from the second direction axis DR2.

FIGS. 4A, 4B, 4C, 4D, and 4E each exemplarily illustrate that the display device ED shown in FIG. 2 is folded.

Figure 4A:
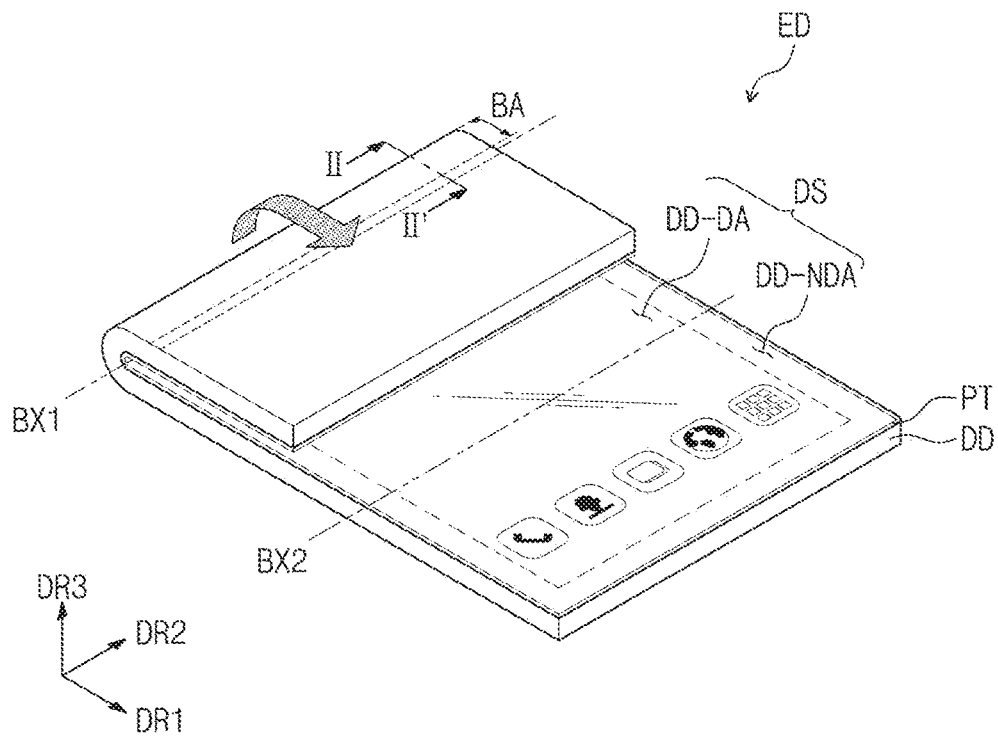
FIGS. 4A, 4B, 4C, 4D, and 4E each illustrate that the display device shown in FIG. 2 is folded.

Referring to FIG. 4A, the display device ED may be in-foldable about the first bending axis BX1. In an exemplary embodiment of the display device ED of the inventive concepts shown in FIG. 4A to FIG. 4E, the display device ED is illustrated as only being in-foldable about the first bending axis BX1. However, exemplary embodiments of the inventive concepts are not limited thereto. Unlike what is illustrated, the display device ED may be out-foldable about the first bending axis BX1. That is, the display device ED is capable of both being in-foldable and out-foldable about the first bending axis BX1.

As used herein, being "in-foldable" refers to a state in which the display regions DD-DA are folded so as to face each other, and being "out-foldable" refers to a state in which the display regions DD-DA are folded so as not to face each other.

Figure 4B:
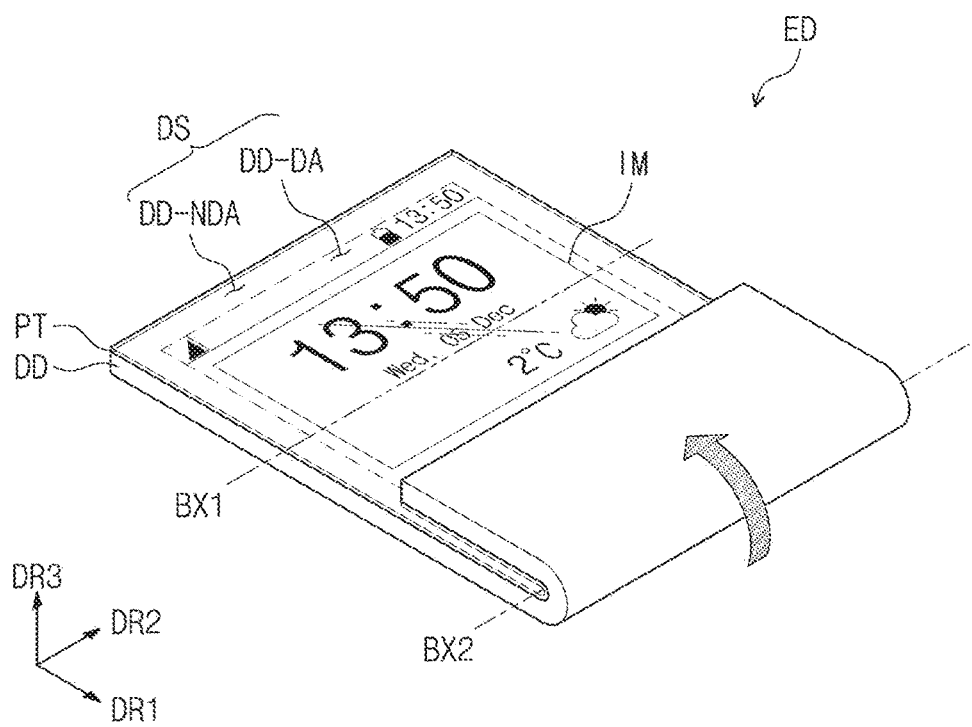
Figure 4C:
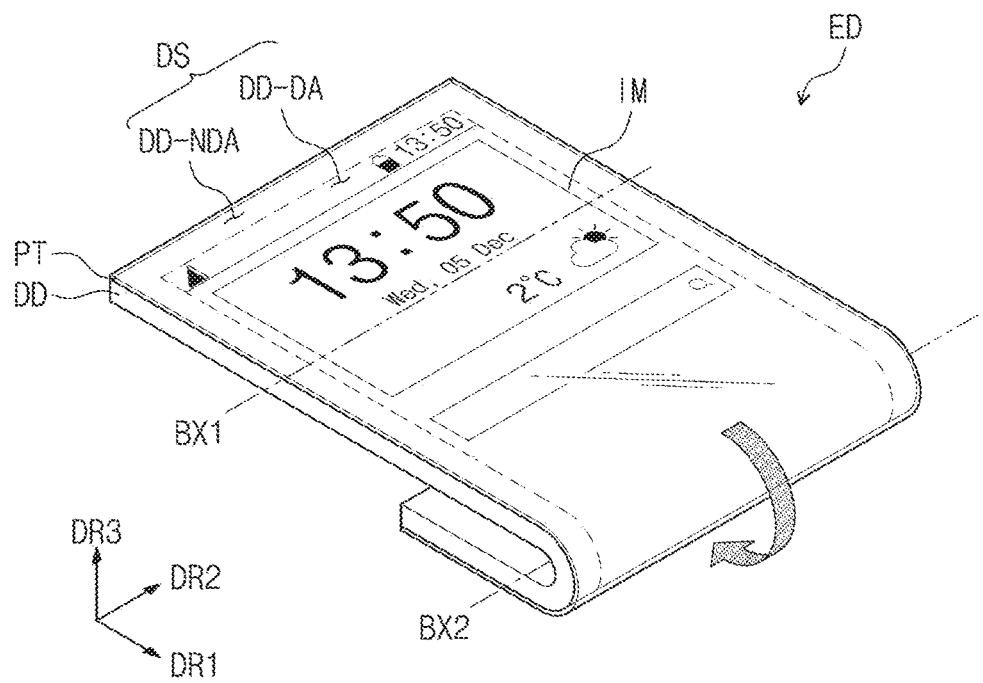

Referring to FIG. 4B, the display device ED may be in-foldable about the second bending axis BX2. Referring to FIG. 4C, the display device ED of the inventive concepts may be out-foldable about the second bending axis BX2. That is, the display device ED is capable of both being in-foldable and out-foldable about the second bending axis BX2.

Figure 4D:
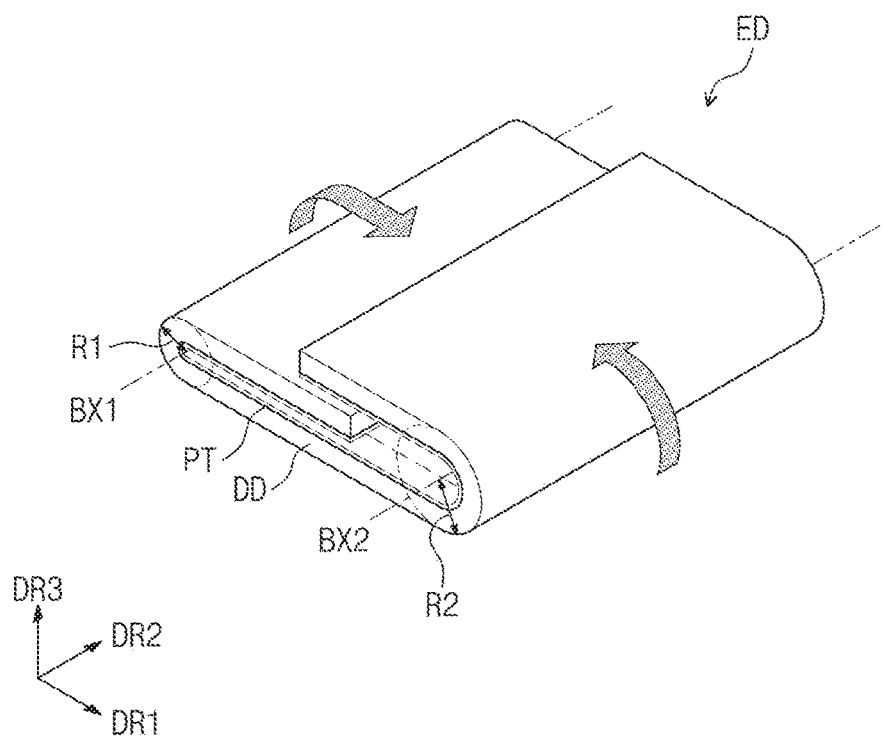
Figure 4E:
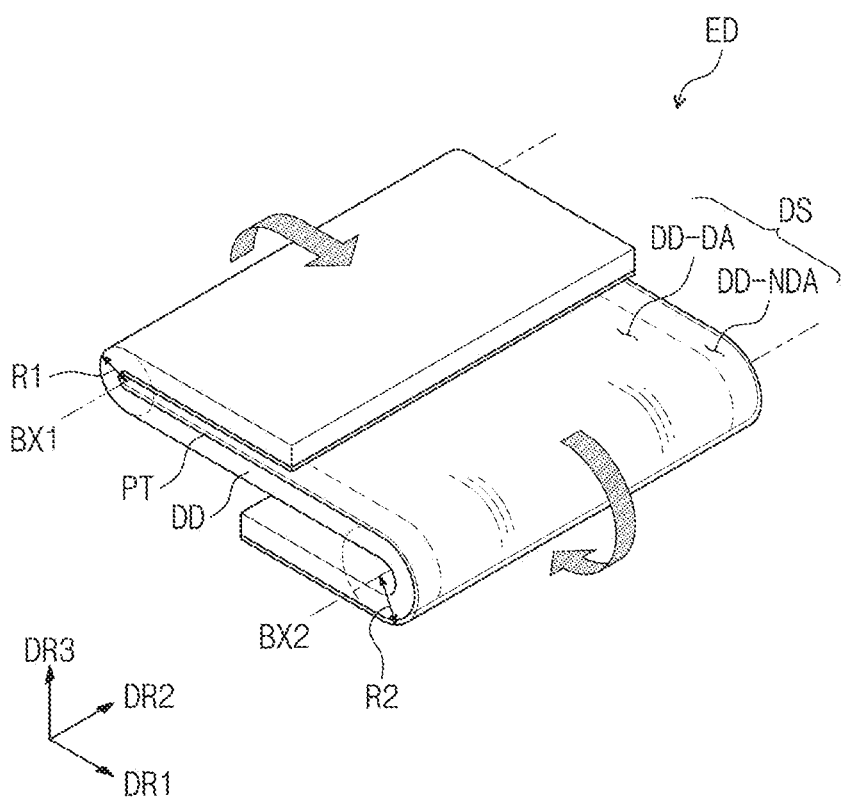

In FIG. 4D, the display device ED is exemplarily illustrated as being in-foldable about the first bending axis BX1 and in-foldable about the second bending axis BX2. In FIG. 4E, the display device ED is exemplarily illustrated as being in-foldable about the first bending axis BX1 and out-foldable about the second bending axis BX2.

When the display device ED is folded about at least one of the bending axes BX1 or BX2, the radius of curvature may be 1 mm to 5 mm with respect to at least one of the bending axes BX1 or BX2. Meanwhile, referring to FIG. 4D and FIG. 4E, a radius of curvature when the display device ED is bent about the first bending axis BX1 R1 (hereinafter, a first radius of curvature) may be smaller than a radius of curvature when the display device ED is bent about the second bending axis BX2 R2 (hereinafter, a second radius of curvature).

In an exemplary embodiment of the inventive concepts shown in FIG. 4A to FIG. 4E, the display device ED is illustrated as being in-foldable about the first bending axis BX1, and being able in-foldable and out-foldable about the second bending axis BX2. In this case, in the display device ED of an exemplary embodiment, a portion corresponding to the second bending axis BX2 may be applied with a bigger stress than a portion corresponding to the first bending axis BX1. Accordingly, by allowing the second radius of curvature R2 to be greater than the first radius of curvature R1, it is possible to reduce the stress applied to the portion corresponding to the second bending axis BX2 in the display device ED.

FIG. 4A to FIG. 4E exemplarily illustrate a method for folding the display device ED. However, exemplary embodiments of the inventive concepts are not limited thereto.

Figure 5:
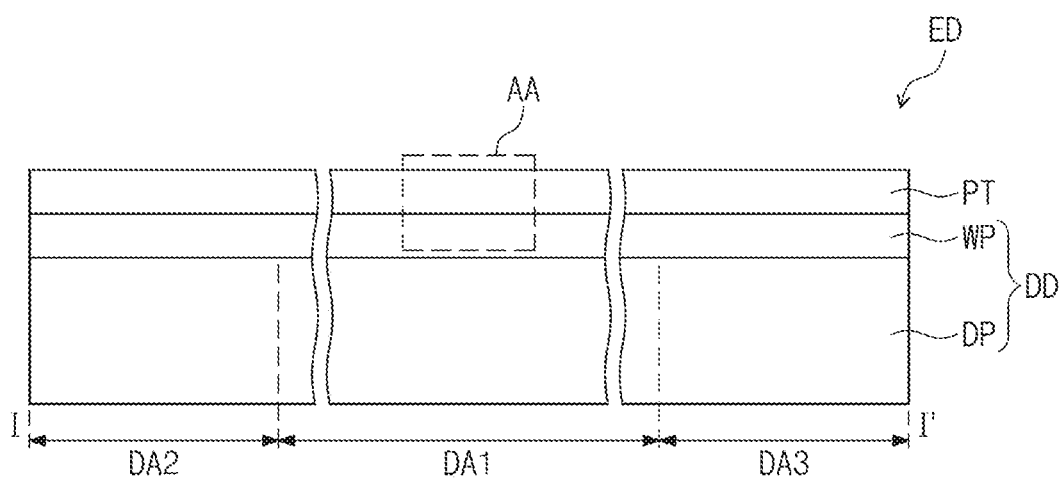
FIG. 5 is a cross-sectional view of a display device according to an exemplary embodiment of the inventive concepts.
Figure 6A:
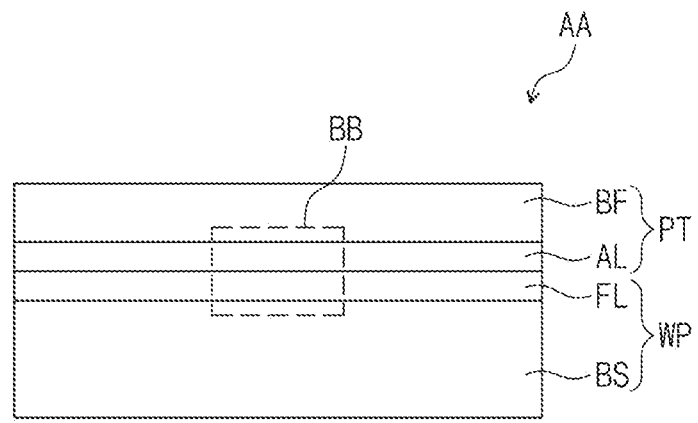
FIG. 6A is a cross-sectional view showing AA region of FIG. 5.
Figure 6B:
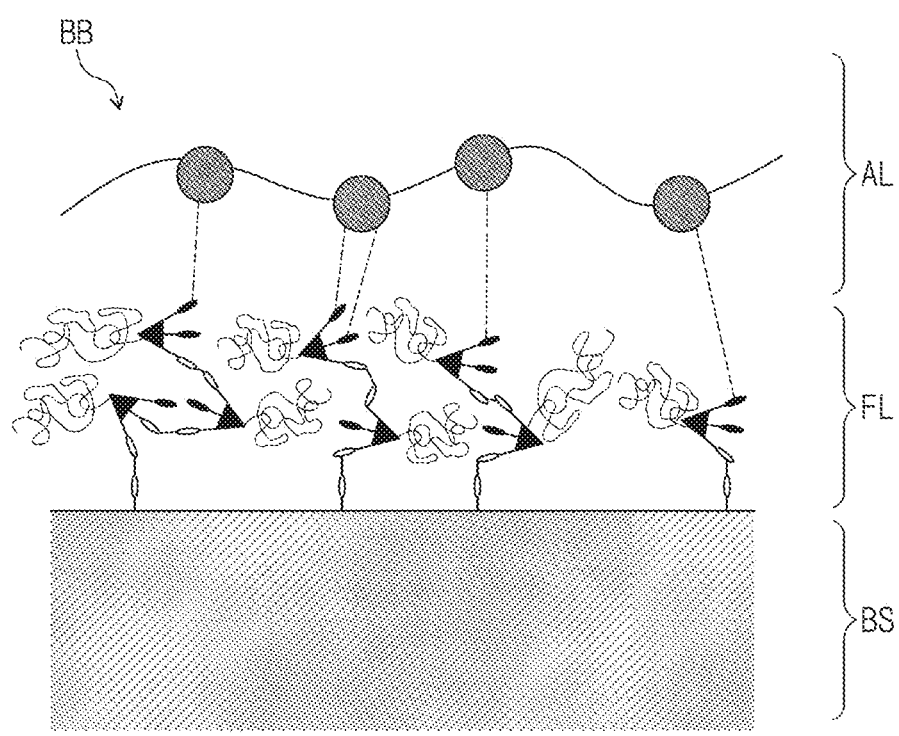
FIG. 6B is a view schematically showing BB region of FIG. 6A.

FIG. 5 is a cross-sectional view of the display device ED according to an exemplary embodiment of the inventive concepts. FIG. 5 is a cross-sectional view schematically showing a portion corresponding to line I-I' of FIG. 2. FIG. 6A is a cross-sectional view showing "AA" region of FIG. 5, and FIG. 6B is a view schematically showing "BB" region of FIG. 6A.

Referring to FIG. 5, the display device ED of an exemplary embodiment includes the display module DD and the protective tape PT disposed on the display module DD, and the display module DD may include a display panel DP and a window WP. Meanwhile, referring to FIG. 6A, the window WP includes a base substrate BS and a functional layer FL, and the protective tape PT may include the polymer film BF and the adhesive layer AL.

The window WP may include the base substrate BS and at least one functional layer FL disposed on the base substrate BS. The base substrate BS may include a glass substrate or a polymer resin substrate. For example, the base substrate BS used for the window WP may include a tempered glass substrate which has been reinforced. Also, the base substrate BS may be a polymer resin substrate. For example, the base substrate BS may be formed of a polyimide resin or the like. The base substrate BS included in the window WP may have high transmittance. By having high transmittance, the window WP may transmit an image provided from the display panel DP as it is, and may protect the display panel DP from external impact.

The functional layer FL may include at least one of a hard coating layer, a fingerprint prevention layer, or a scattering prevention layer. In an exemplary embodiment, the functional layer FL may be a fingerprint prevention layer. In an exemplary embodiment, the functional layer FL may include a fluorine-containing silane compound.

Referring to FIG. 6B, the functional layer FL may be a layer including a fluorine-containing silane compound in which a silane portion and a fluorinated carbon portion are linked by an alkyl chain. Also, the fluorine-containing silane compound may have a siloxane end, and the siloxane end may be coupled to the base substrate BS side.

The silane portion of the fluorine-containing silane compound forming the functional layer FL may form a bond with an adhesive of the adhesive layer AL. The bonding of the silane portion and the adhesive may be an electrostatic attraction bond or a hydrogen bond, or the like.

The display panel DP generates an image, and may provide the generated image to the front surface thereof. The display panel DP may provide the generated image in the third direction axis DR3 (see FIG. 2). For example, the display panel DP may be an organic light emitting display panel. However, exemplary embodiments of the inventive concepts are not limited thereto. The display panel DP may be a liquid crystal display panel, a plasma display panel, an electrophoretic display panel, a microelectromechanical system display panel, or an electrowetting display panel, and the like.

The display panel DP may be a flexible display panel. The display panel DP may include a flexible substrate.

The window WP may be disposed on the display panel DP, and the protective tape PT may be attached on the window WP. The adhesive layer AL of the protective tape PT may be in contact with the window WP. Also, the adhesive layer AL of the protective tape PT may be in contact with the functional layer FL.

As described above, the adhesive layer AL of the protective tape PT has a storage modulus at −20° C. of 30 KPa to 100 KPa and a creep value of 100% to 800% when a load of 3 N is maintained for 2 hours at room temperature, and the protective tape PT has an adhesion strength of 10 gf/inch to 20 gf/inch with respect to the functional layer FL. Therefore, even when the display device ED is repeatedly folded and unfolded, the surface thereof may be protected by the protective tape PT without the damage to the protective tape PT. Also, the protective tape PT relaxes stress in the adhesive layer AL even when the display device ED is deformed, thereby minimizing the damage to the protective tape PT and maintaining good adhesion with respect to the window WP.

Figure 7A:
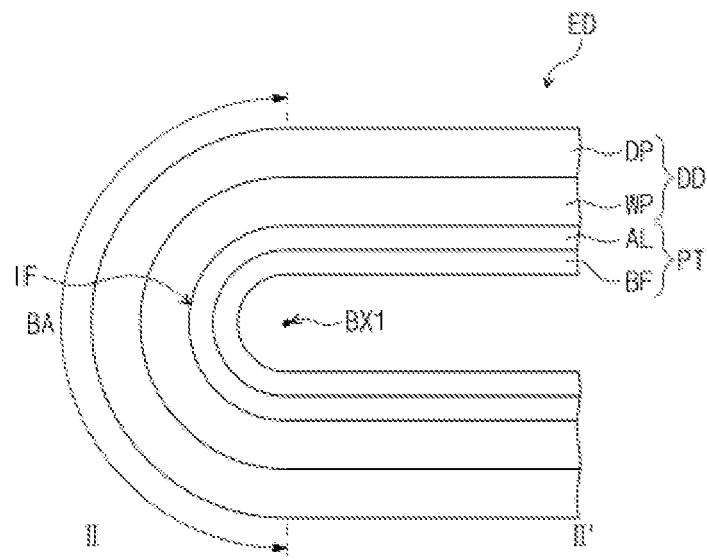
FIG. 7A is a cross-sectional view of a display device according to an exemplary embodiment of the inventive concepts.

FIG. 7A is a cross-sectional view showing the display device ED of an exemplary embodiment in a folded state. FIG. 7A may show a portion corresponding to line II-IF of FIG. 4A. FIG. 7A shows the display device ED in an in-folded state. The display device ED may include a bending portion BA which may be deformed to a bent shape or has a bent shape about the first bending axis BX1.

In the bending portion BA of the display device ED of an exemplary embodiment, a contact state at an interface IF between the protective tape PT and the display module DD may be well maintained. This is believed to be due to the fact that the adhesive layer AL has a storage modulus at −20° C. of 30 KPa to 100 KPa and a creep value of 100% to 800% when a load of 3 N is maintained for 2 hours at room temperature, thereby relaxing stress provided to the interface IF between the protective tape PT and the display module DD in the bending portion BA.

Figure 7B:
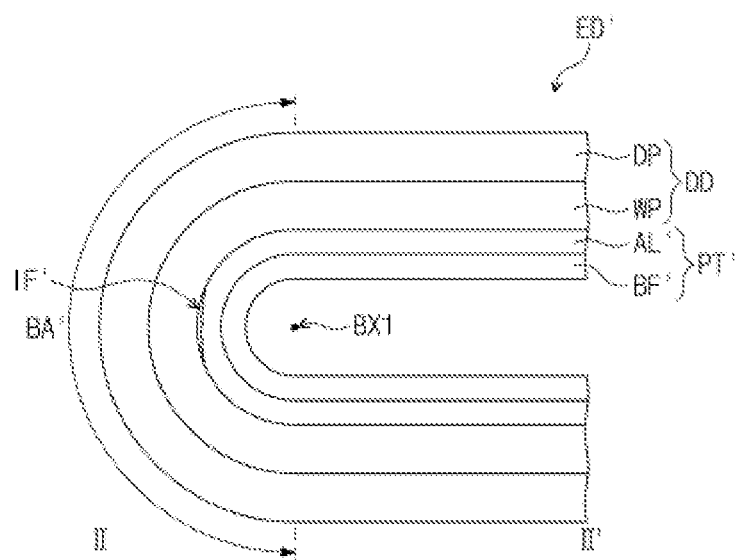
FIG. 7B is a cross-sectional view of a typical display device.

In contrast, referring to FIG. 7B which shows a display device ED' of Comparative Example corresponding to the display device ED of FIG. 7A, an interface IF' between a protective tape PT' and the display module DD in a bending portion BA' may be detached, where protective tape PT' includes adhesive layer AL' and polymer film BF'. This detachment believed to be due to the fact that an adhesive layer AL' could not sufficiently relax stress in the bending portion BA', thereby causing the deformation of the adhesive layer AL' at the interface IF'.

A protective tape of an exemplary embodiment has an adhesive layer having a low storage modulus at −20° C. of 30 KPa to 100 KPa and a relatively high creep value of 100% to 800% at room temperature, thereby maintaining good adhesion and good durability even when used for a display device which may be deformed and used. Also, a display device of an exemplary embodiment uses a protective tape including an adhesive layer having a low storage modulus and a high creep value, so that the surface of a display module may be protected. That is, even when the shape of the display device is deformed by being folded and bent, the surface of the display module may be protected by the protective tape without the damage of the protective tape or the detachment of the protective tape.

An exemplary embodiment of the inventive concepts may provide a protective tape including an adhesive layer having a low storage modulus and high creep properties, thereby minimizing the deformation of the adhesive layer even with repeated folding.

An exemplary embodiment of the inventive concepts may provide a display device including a protective tape having an adhesive layer with a low storage modulus and high creep properties, thereby maintaining high adhesion strength with respect to the surface of a display module even with repeated folding.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display module foldable about a first bending axis and a second bending axis spaced apart from each other; and
a protective tape disposed on the display module and including a polymer film and an adhesive layer disposed between the polymer film and the display module,
wherein:
the adhesive layer has a storage modulus at −20° C. of 30 KPa to 100 KPa, and has a creep value of 100% to 800% when a load of 3 N is maintained for 2 hours at room temperature;
the display device is in-foldable about the first bending axis and in-foldable and out-foldable about the second bending axis; and
a first radius of curvature of the first bending axis is smaller than a second radius of curvature of the second bending axis.

2. The display device of claim 1, wherein the display module and the protective tape are folded to have a radius of curvature of 1 mm to 5 mm about at least one bending axis extended in one direction.

3. The display device of claim 1, wherein the display module comprises a display panel and a window disposed on the display panel.

4. The display device of claim 3, wherein the window comprises:
a base substrate; and
at least one functional layer disposed on the base substrate and including a fluorine-containing silane compound.

5. The display device of claim 4, wherein an adhesion strength of the protective tape with respect to the at least one functional layer is 10 gf/inch to 20 gf/inch.

6. The display device of claim 4, wherein a thickness of the polymer film is 70 μm to 130 μm, and the thickness of the adhesive layer is 35 μm to 65 μm.

7. A display device comprising:
a display module foldable about a first bending axis and a second bending axis spaced apart from each other, the display module comprising a display panel and a window disposed on the display panel; and
a protective tape disposed on the display module and including a polymer film and an adhesive layer disposed between the polymer film and the display module, wherein:
the window comprises:
   a base substrate; and
   at least one functional layer disposed on the base substrate and including a fluorine-containing silane compound;
the adhesive layer has a storage modulus at −20° C. of 30 KPa to 100 KPa, and has a creep value of 100% to 800% when a load of 3 N is maintained for 2 hours at room temperature;
the display device is in-foldable about the first bending axis and in-foldable and out-foldable about the second bending axis;
a first radius of curvature of the first bending axis is smaller than a second radius of curvature of the second bending axis; and
the polymer film is a thermoplastic polyurethane film, and the adhesive layer is formed of an acryl-based resin.

8. A display device including a bending portion which is able to be deformed to a bent shape or has a bent shape about a bending axis extending in one direction, the display device comprising:

a display module; and
a protective tape disposed on the display module, wherein the protective tape includes:
an adhesive layer in contact with the display module; and
a polymer film disposed on the adhesive layer,
wherein:
the adhesive layer has a storage modulus at −20° C. of 30 KPa to 100 KPa, and has a creep value of 100% to 800% when a load of 3 N is maintained for 2 hours at room temperature;
the display module comprises:
   a display panel; and
   a window disposed on the display panel, wherein the adhesive layer is in contact with the window;
the window comprises:
   a base substrate; and
   a functional layer disposed on the base substrate; and
an adhesion strength of the protective tape with respect to the functional layer is 10 gf/inch to 20 gf/inch.

9. The display device of claim 8, wherein the adhesive layer is a pressure sensitive adhesive (PSA) formed of an acryl-based resin.

* * * * *